(12) United States Patent
Kim

(10) Patent No.: US 8,811,083 B2
(45) Date of Patent: Aug. 19, 2014

(54) SEMICONDUCTOR MEMORY DEVICE AND METHOD OF OPERATING THE SAME

(75) Inventor: Hyung Seok Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 26 days.

(21) Appl. No.: 13/601,578

(22) Filed: Aug. 31, 2012

(65) Prior Publication Data

US 2013/0163334 A1    Jun. 27, 2013

(30) Foreign Application Priority Data

Dec. 22, 2011    (KR) ........................ 10-2011-0139985

(51) Int. Cl.
*G11C 11/34*    (2006.01)
*G11C 16/04*    (2006.01)
*G11C 11/56*    (2006.01)

(52) U.S. Cl.
CPC ........ *G11C 16/0483* (2013.01); *G11C 11/5628* (2013.01)

USPC .............................. 365/185.12; 365/185.24

(58) Field of Classification Search
CPC ................... G11C 16/0483; G11C 11/5628
USPC .......................................... 365/185.12, 185.24
See application file for complete search history.

(56) References Cited

U.S. PATENT DOCUMENTS 6,954,380 B2 * 10/2005 Ono et al. ................ 365/185.24
7,633,803 B2 * 12/2009 Lee .......................... 365/185.19
8,305,816 B2 * 11/2012 Park et al. ................ 365/185.22

* cited by examiner

*Primary Examiner* — Michael Tran
(74) *Attorney, Agent, or Firm* — William Park & Associates Patent Ltd.

(57) ABSTRACT

A semiconductor memory device and a method of operating the same include a circuit group configured to apply a program maintaining voltage between the program prohibition voltage and the program permission voltage to bit lines connected to programmed memory cells to prevent a decrease in threshold voltage.

18 Claims, 6 Drawing Sheets

SEMICONDUCTOR MEMORY DEVICE AND METHOD OF OPERATING THE SAME

CROSS-REFERENCE TO RELATED APPLICATION

This application claims priority under 35 U.S.C 119(a) to and the benefit of Korean Patent Application No. 10-2011-0139985, filed on Dec. 22, 2011, the disclosure of which is incorporated herein by reference in its entirety.

BACKGROUND

1. Field of Invention

The present invention relates to a semiconductor memory device and a method of operating the same. More specifically, the present invention relates to a method of programming a semiconductor memory device.

2. Description of the Related Art

A semiconductor memory device may include a memory cell array in which data is stored, and the memory cell array may include a plurality of memory cell blocks. Each of the memory cell blocks may include a plurality of cell strings disposed parallel to one another, and each of the cell strings may include a plurality of memory cells.

Figure 1:
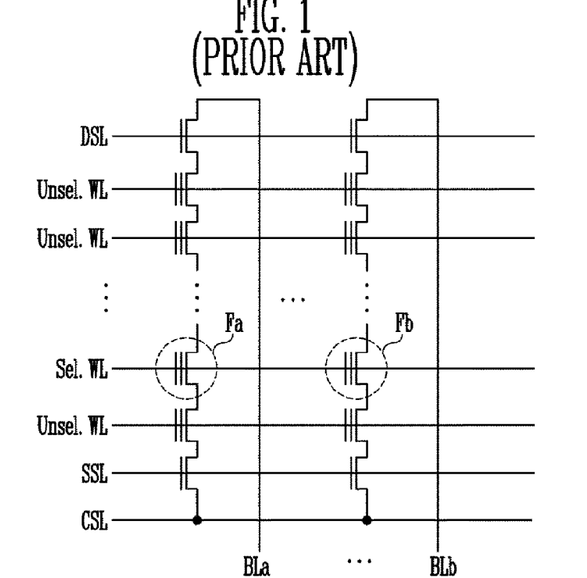
FIG. 1 is a circuit diagram of a conventional memory cell block.

FIG. 1 is a circuit diagram of a conventional memory cell block.

Referring to FIG. 1, memory cells included in a memory cell array have the same configuration, and thus only one memory cell block will now be described.

The memory cell block may include a plurality of cell strings, and each of the cell strings may include a drain selection transistor, memory cells, and a source selection transistor connected in series. Drain selection transistors included in different cell strings may be connected to a drain selection line DSL, memory cells included in the different cell strings may be connected to word lines WL, and source selection transistors included in the different cell strings may be connected to a source selection line SSL. Sources of the source selection transistors may be connected to a common source line CSL, while drains of the drain selection transistors may be connected to bit lines BL.

In general, a programming operation may be performed in units of pages, which are units of memory cells connected to the same word line. For example, the programming operation may include applying a pass voltage to unselected word lines Unsel.WL and applying a program voltage to a selected word line Sel.WL with a program permission voltage applied to selected bit lines BLa and BLb and with a program prohibition voltage applied to unselected bit lines.

In recent years, a programming operation has been performed using an incremental step pulse program (ISPP) method by which a program voltage is gradually elevated to narrow a range of distribution of memory cells. Accordingly, even if a programming operation is performed on the same page, the time taken to complete a program may vary due to a difference in operating speed between memory cells. For example, when both a first memory cell Fa and a second memory cell Fb are selected memory cells, even if a program voltage is applied to a selected word line Sel.WL, the time taken to elevate threshold voltages of the first and second memory cells Fa and Fb may differ. Even if the threshold voltage of the first memory cell Fa becomes higher than a target level to complete a program operation, when the threshold voltage of the second memory cell Fb is lower than the target level the programming operation may have to be repeatedly performed by applying the program voltage to the selected word line Sel.WL until the threshold voltage of the second memory cell Fb becomes higher then the target level. In this case, while a program permission voltage is applied to a second bit line BLb associated with the second memory cell Fb, a program prohibition voltage may be applied to a first bit line BLa associated with the programmed first memory cell Fa, thus the threshold voltage of the first memory cell Fa cannot be elevated during the program operation performed on the second memory cell Fb. In general, the program permission voltage may refer to a ground voltage (e.g., 0V), while the program prohibition voltage may refer to a power supply voltage Vcc. However, the programmed first memory cell Fa may be affected by a gradually elevated program voltage until programming of the second memory cell Fb is completed, as will be described in detail with reference to the following drawings.

Figure 2:
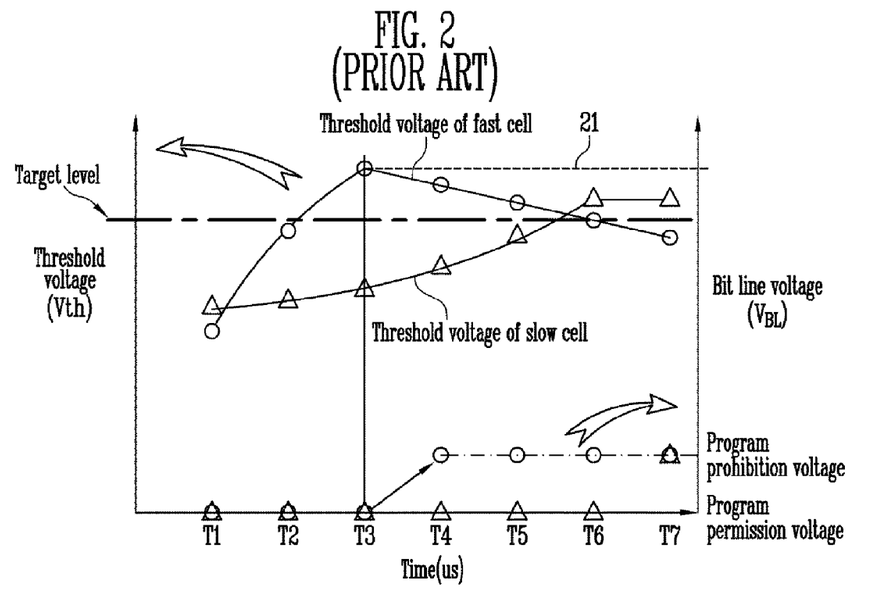
FIG. 2 is a graph of a threshold voltage and a bit line voltage illustrating conventional programming operation threshold voltage levels.

FIG. 2 is a graph of a threshold voltage and a bit line voltage, illustrating problems that may occur with conventional programming of a fast and slow memory cell.

Referring to FIG. 2, a fast cell may correspond to the first memory cell Fa of FIG. 1, while a slow cell may correspond to the second memory cell Fb of FIG. 1. When a program permission voltage is applied to a bit line and a gradually elevated program voltage is applied to a selected word line (T1 to T2), a threshold voltage of the fast cell rapidly increases and becomes higher than a target level at a time point T3. However, since a threshold voltage of the slow cell is lower than a target level at the time point T3, a programming operation for elevating the threshold voltage of the slow cell should continue to be performed. During programming of the slow cell, a program prohibition voltage is applied to a bit line connected to the fast cell. In this case, boosting may occur in a channel region due to an increase in capacitance between the gradually elevated program voltage and the program prohibition voltage applied to the bit line. When an electric potential of the channel region is elevated, electrons trapped in the fast cell may leak out and lower the threshold voltage of the fast cell. Since the program voltage is repeatedly elevated until the threshold voltage of the slow cell becomes higher than the target level, the threshold voltage of the fast cell is repeatedly decreased. Accordingly, after the threshold voltage of the slow cell becomes higher than the target level (T6), the threshold voltage of the fast cell may be lower than the target level.

Figure 3:
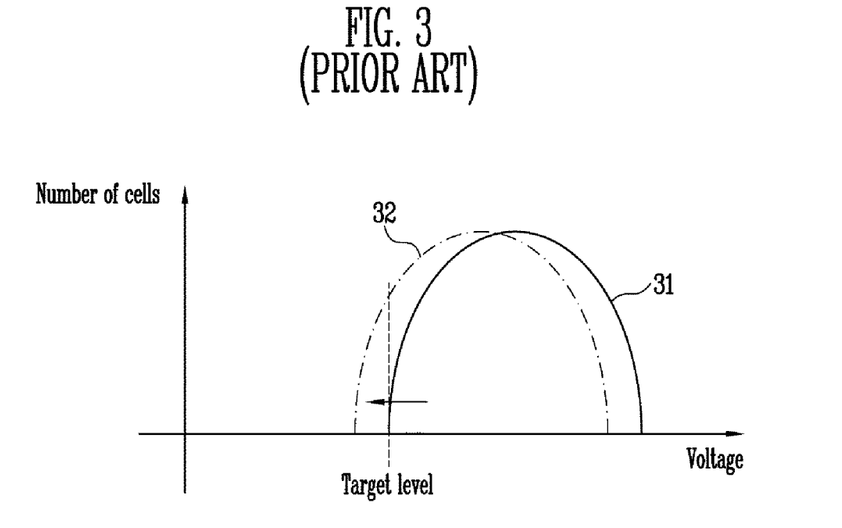
FIG. 3 is a graph of a threshold voltage associated with a conventional programming operation.

FIG. 3 is a graph of a threshold voltage, illustrating problems that may occur with conventional programming of a fast and slow memory cell.

Referring to FIG. 3, when a programming operation of a selected page is completed, a distribution 31 of threshold voltages of selected memory cells included in the selected page should be equal to or higher than a target level. However, target voltages of some of the programmed memory cells may become lower than a target level because of the influence of a program prohibition voltage applied to a bit line and a program voltage applied to a selected word line while trying to program all unprogrammed memory cells. Accordingly, even if the programming operation of the selected page is completed, a distribution 32 of threshold voltages of selected memory cells may be lower than a target level, thereby decreasing the reliability of the programming operation.

SUMMARY OF THE INVENTION

The present invention is directed to a semiconductor memory device and a method of operating the same that can improve the reliability of a programming operation.

One aspect of the present invention provides a semiconductor memory device including: a memory cell array including a plurality of memory cells, a control circuit configured to control a programming operation of the memory cells connected to a selected word line, and a circuit group configured to apply a program prohibition voltage to bit lines connected to memory cells not to be programmed, apply a program permission voltage to bit lines connected to memory cells having a threshold voltage lower than a target level, among memory cells to be programmed, and apply a program maintaining voltage having a level between a program prohibition voltage level and a program permission voltage level to bit lines connected to programmed memory cells to prevent a decrease in threshold voltage when the memory cells connected to the selected word line are programmed.

Another aspect of the present invention provides a method of operating a semiconductor memory device, including: applying a program permission voltage to selected bit lines and applying a program voltage to a selected word line to program memory cells connected to the selected word line, performing a verification operation to compare a threshold voltage of the memory cells with a target level, and applying a program maintaining voltage to bit lines of programmed memory cells during the verification operation to perform a programming operation on the memory cells connected to the selected word line.

Still another aspect of the present invention provides a method of operating a semiconductor memory device, including: verifying whether threshold voltages of memory cells, to which a program voltage has been applied, is higher than a target level, and applying a program maintaining voltage to bit lines of memory cells having a threshold voltage above the target level during a subsequent programming operation, where a level of the program maintaining voltage is between a program prohibition voltage level and a program permission voltage level.

BRIEF DESCRIPTION OF THE DRAWINGS

The above and other features and advantages of the present invention will become more apparent to those of ordinary skill in the art by describing in detail example embodiments thereof with reference to the attached drawings in which.

DETAILED DESCRIPTION OF EMBODIMENTS

The present invention will be described more fully hereinafter with reference to the accompanying drawings, in which example embodiments of the invention are shown. This invention may, however, be embodied in different forms and should not be construed as limited to the embodiments set forth herein. Rather, these example embodiments are provided so that this disclosure is thorough and fully conveys a scope of the present invention to one skilled in the art.

Figure 4:
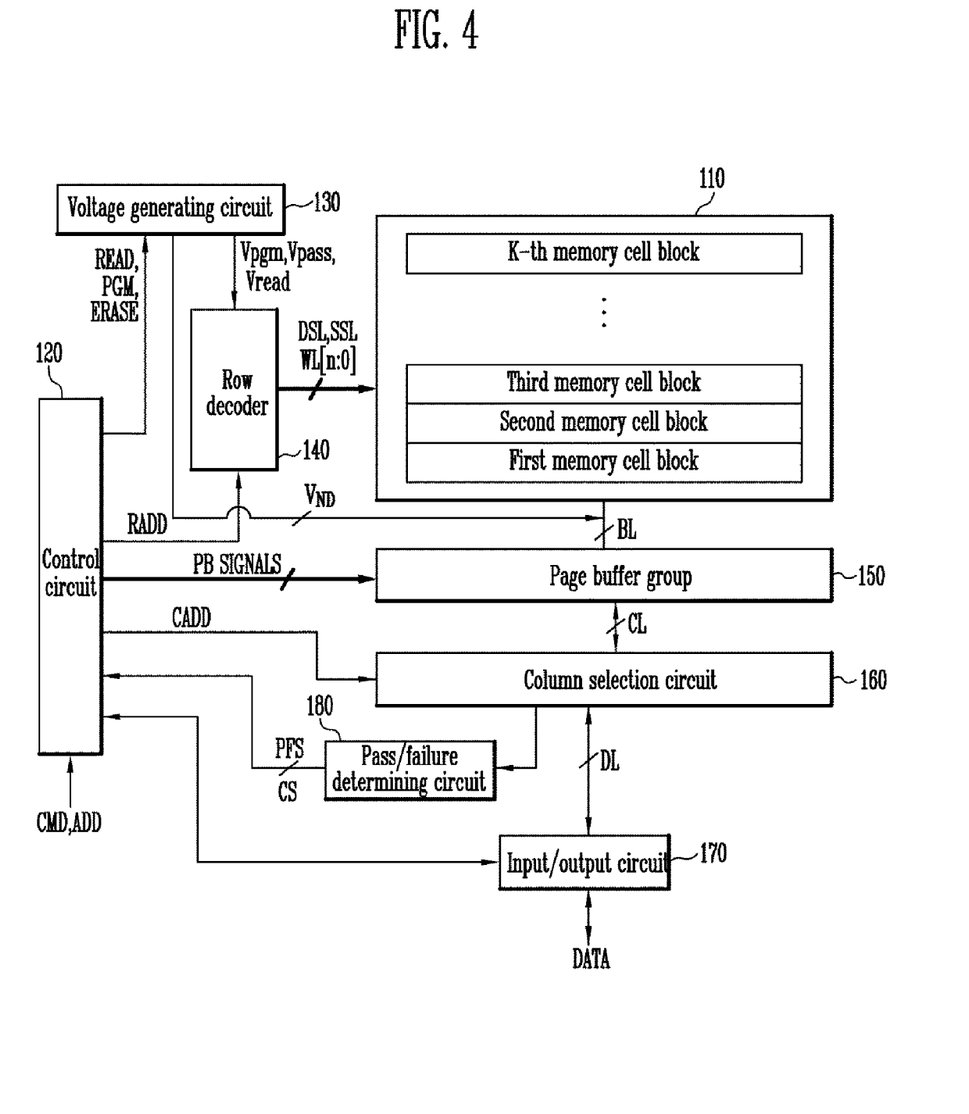
FIG. 4 is a block diagram of a semiconductor memory device, illustrating a programming method according to an example embodiment of the present invention.

FIG. 4 is a block diagram of a semiconductor memory device used in illustrating a programming method according to an example embodiment of the present invention.

Referring to FIG. 4, the semiconductor memory device may include a memory cell array 110, a circuit group 130, 140, 150, 160, 170, and 180 configured to perform a programming operation or a read operation on memory cells included in the memory cell array 110, and a control circuit 120 configured to control the circuit group 130, 140, 150, 160, 170, and 180 to set levels of threshold voltages of selected memory cells according to input data. The memory cells may be coupled to world lines WL.

The circuit group 130, 140, 150, 160, 170, and 180 may include a voltage generating circuit 130, a row decoder 140, a page buffer group 150, a column selection circuit 160, an input/output (I/O) circuit 170, and a pass/failure determining circuit 180.

The memory cell array 110 may include a plurality of memory cell blocks, each of which may include a plurality of cell strings. An example memory cell block which may be found in the memory cell array 110 will be described with reference to FIG. 5.

The control circuit 120 may output internal command signals such as, a program operating signal PGM, a read operating signal READ, or an erase operating signal ERASE in response to a command signal CMD. Also, the control circuit 120 may output page buffer signals PB SIGNALS according to a type of operation for controlling page buffers included in the page buffer group 150. Furthermore, the control circuit 120 may output internal commands, such as, a row address signal RADD and a column address signal CADD in response to an address signal ADD. Also, the control circuit 120 may confirm whether each of the threshold voltages of the selected memory cells has increased to a target voltage or decreased in response to a pass/failure signal PFS. The control circuit 120 may also determine whether a programming or erase operation is to be re-performed, has completed, or has failed based on a confirmation result.

In particular, the control circuit 120 may apply a program maintaining voltage $V_{ND}$ to bit lines BL connected to corresponding memory cells during a programming operation of a selected page in order to prevent under programming of memory cells whose threshold voltages have become higher than a target level before other cells. A method of varying voltages of the bit lines BL may be variously embodied. For example, the control circuit 120 may control the voltage generating circuit 130 to output the program maintaining voltage $V_{ND}$ to the corresponding bit lines BL in response to address information CS regarding the memory cells of the selected page whose threshold voltages have become higher than the target level. The address information CS may be output from the pass/failure determining circuit 180. The page buffer group 150 may apply a program permission voltage to selected bit lines and apply a program prohibition voltage to unselected bit lines. The program maintaining voltage $V_{ND}$ may be set within a range of between the program permission voltage and the program prohibition voltage. The program maintaining voltage $V_{ND}$ may be varied in accordance with a variable program voltage in an ISPP programming operation. Specifically, since the program voltage is gradually elevated during the ISPP programming operation, the program maintaining voltage $V_{ND}$ also may be set to gradually increase. For instance, after a program maintaining voltage $V_{ND}$ corresponding to each program voltage is designated, when memory cells having a higher threshold voltage than a target level are detected during the programming operation, the program maintaining voltage $V_{ND}$ corresponding to the program voltage applied to a selected word line may be subsequently applied to the bit lines corresponding to memory cells having a higher threshold voltage than the target level.

The voltage generating circuit 130 may output a program voltage Vpgm, a pass voltage Vpass, or a read voltage Vread to global lines in response to operating signals PGM, READ, and ERASE, and the voltage generating circuit 130 may output the program maintaining voltage $V_{ND}$ to bit lines corresponding to programmed memory cells during the programming operation.

The row decoder 140 may transmit operating voltages generated by the voltage generating circuit 130 to lines DSL, SSL, and WL[n:0] of a selected memory cell block in response to row address signals RADD of the control circuit 120.

The page buffer group 150 may include a plurality of page buffers configured to operate in response to the page buffer signals PB SIGNALS output by the control circuit 120. Each of the page buffers may include a plurality of latches and apply a program permission voltage or a program prohibition voltage to selected bit lines and unselected bit lines according to program data stored in each of the latches during a programming operation. For example, the program permission voltage may be a voltage having a ground voltage (0V), and the program prohibition voltage may be set to a voltage having a power supply voltage Vcc.

The column selection circuit 160 may select page buffers included in the page buffer group 150 in response to the column address signal CADD output by the control circuit 120. Data latched in a page buffer selected by the column selection circuit 160 may be output. Also, the column selection circuit 160 may receive data output by the page buffer group 150 through a column line CL and transmit the data to the I/O circuit 170.

To respectively transmit externally input program data DATA to the page buffers of the page buffer group 150 during the programming operation, the I/O circuit 170 may transmit the program data DATA to the column selection circuit 160 under control of the control circuit 120. When the program data DATA is sequentially transmitted to respective page buffers of the page buffer group 150 by the column selection circuit 160, each of the page buffers may store the input program data DATA in an internal latch. During a read operation, the I/O circuit 170 may externally output the data DATA transmitted from the page buffers of the page buffer group 150 through the column selection circuit 160.

The pass/failure determining circuit 180 may not only transmit the address information CS regarding the memory cells to the control circuit 120 during the programming operation as described above, but may also transmit the pass/failure signal PFS to the control circuit 120 based on a verification result of the programming operation.

Figure 5:
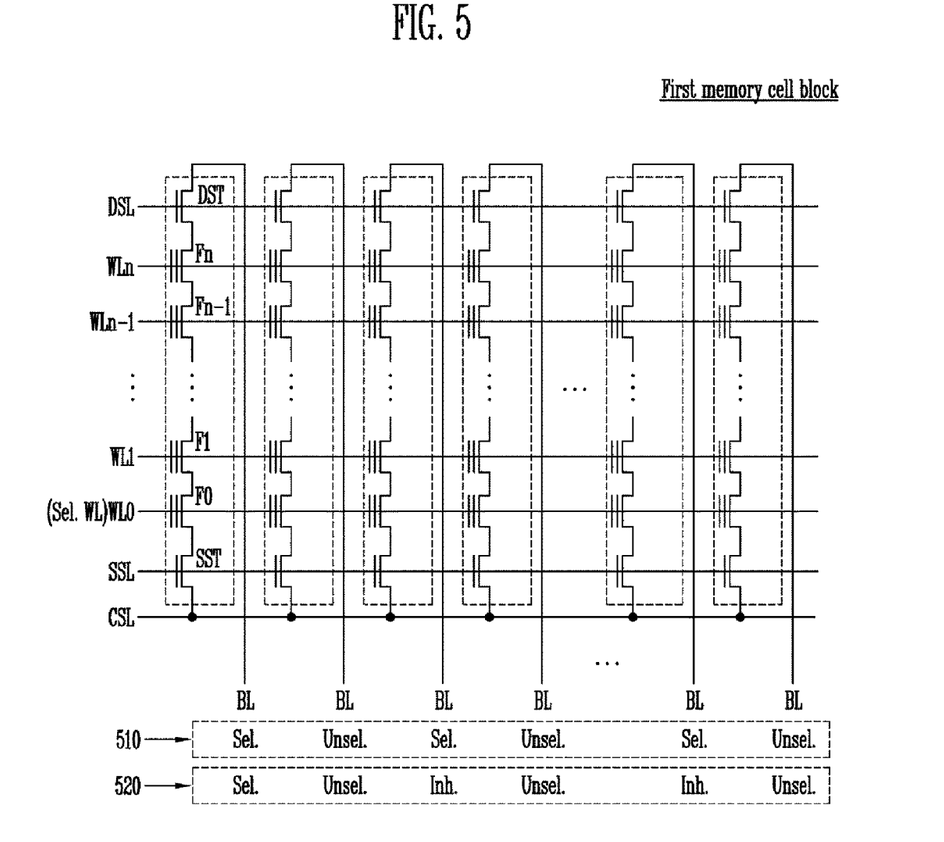
FIG. 5 is a circuit diagram of a memory cell block of FIG. 4.

FIG. 5 is a circuit diagram of the memory cell block of FIG. 4.

Referring to FIG. 5, the memory cell block of the semiconductor memory device may include a plurality of cell strings connected between bit lines BL and a common source line CSL. The cell strings may have the same configuration. One of the cell strings will now be described in detail. Each of the cell strings may include a drain selection transistor DST, memory cells F0 to Fn, and a source selection transistor SST connected in series. The drain selection transistor DST may be connected to a bit line BL, and the source selection transistor SST may be connected to the common source line CSL. Gates of drain selection transistors DST included in different cell strings may be connected to a drain selection line DSL, gates of the memory cells F0 to Fn may be connected to a plurality of word lines WL0 to WLn, and gates of the source selection transistors SST may be connected to a source selection line SSL.

A programming operation may be performed in units of memory cells connected to the same word line (i.e., units of pages). The programming operation may be performed using an ISPP method by which a gradually elevated program voltage is applied to a selected word line Sel.WL connected to a selected page. In particular, since all threshold voltages of memory cells are lower than a target level during an initial period of the programming operation (510), the programming operation may be performed by applying a program voltage to the selected word line Sel.WL with a program permission voltage applied to selected bit lines Sel.BL and with a program prohibition voltage applied to the remaining unselected bit lines Unsel.BL. When memory cells having threshold voltages higher than the target level are detected during the programming operation (520), a program maintaining voltage for preventing under programming may be applied to bit lines Inh.BL connected with memory cells corresponding to memory cells having voltages higher than the target level. Under programming refers to a phenomenon where the threshold voltage levels of memory cells with threshold voltages higher than a target level gradually decrease during the programming of other memory cells. The programming operation will now be described in detail.

Figure 6:
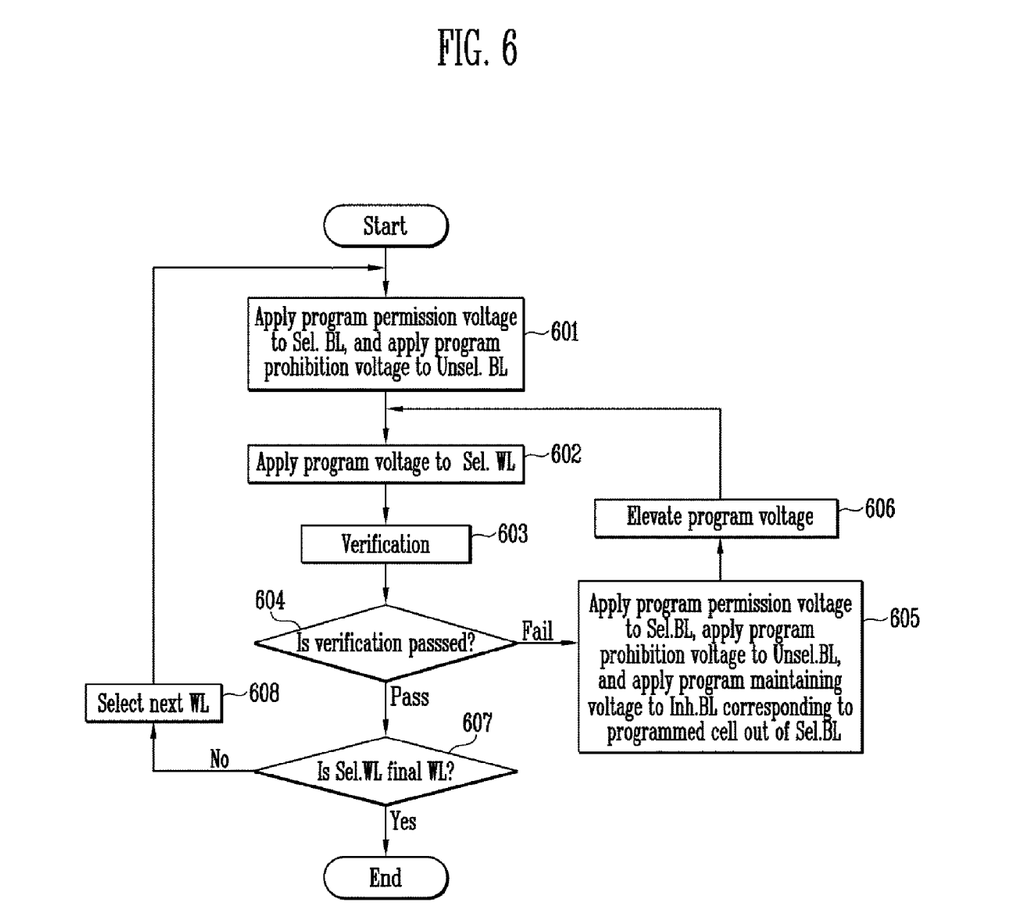
FIG. 6 is a flowchart illustrating a programming method according to an example embodiment of the present invention.

FIG. 6 is a flowchart illustrating a programming method according to an example embodiment of the present invention.

Referring to FIG. 6, a programming operation may be performed using an ISPP method of gradually elevating a program voltage.

Step of Setting Bit Line Voltage (601)

When the programming operation is initiated, a program permission voltage may be applied to selected bit lines Sel.BL, while a program prohibition voltage may be applied to unselected bit lines Unsel.BL. The selected bit lines Sel.BL may refer to bit lines connected to memory cells (selected memory cells) to be programmed in a selected page. The unselected bit lines Unsel.BL may refer to bit lines connected to memory cells (unselected memory cells) not to be programmed in the selected page. The program permission voltage may refer to a ground voltage (e.g., 0V), and the program prohibition voltage may refer to a power supply voltage Vcc.

Step of Applying Program Voltage (602)

The selected bit lines Sel.BL may be connected to channel regions of selected cell strings connected to the selected bit lines Sel.BL, and unselected bit lines Unsel.BL may be connected to channel regions of unselected cell strings connected to the unselected bit lines Unsel.BL so that a voltage applied to the bit lines Sel.BL and Unsel.BL can be transmitted to the channel regions of the cell strings. To elevate threshold voltages of selected memory cells, a program voltage may be applied to a selected word line Sel.WL. A pass voltage may be applied to the remaining unselected word lines.

Alternatively, before applying the program voltage to the selected word line Sel.WL, a step of applying the pass voltage to all word lines of a selected memory cell block may be further included.

Verification Step (603)

By applying a verification voltage to the selected word line Sel.WL, it may be verified whether threshold voltages of selected memory cells are higher than a target level. Specifically, the selected bit lines Sel.BL may be precharged, a verification pass voltage may be applied to unselected word lines, and the verification voltage may be applied to the selected word line Sel.WL. Since memory cells having threshold voltages higher than the target level do not form channels, these bit lines may maintain precharged electric potentials. Conversely, since memory cells having threshold voltages lower than the target level form channels, the electric potentials of these bit lines may be decreased.

Step of Determining Verification (604)

As the result of verification (603), when the electric potentials of all the selected bit lines maintain a level higher than a reference level, if the threshold voltages of all the selected memory cells have reached the target level, the verification step may have passed. However, when the electric potential of at least one of the selected bit lines is lower than the target level, since all the threshold voltages of the selected memory cells are not higher than the target level, the verification step may have failed.

Step of Resetting Bit Line Voltage (605)

When it is determined that the verification step failed, voltages of the bit lines may be reset to selectively program selected memory cells having threshold voltages lower than the target level. Specifically, a program permission voltage may be applied to selected bit lines Sel.BL connected to memory cells having threshold voltages lower than the target level, a program prohibition voltage may be applied to unselected bit lines Unsel.BL, and a program maintaining voltage may be applied to bit lines Inh.BL connected to memory cells having threshold voltages that have become higher than the target level, out of memory cells selected during the start of the programming operation. The program maintaining voltage, which may be a voltage between the program permission voltage and the program prohibition voltage, may have a constant level or vary in response to the program voltage. The variation of the program maintaining voltage will now be described in detail. Since an ISPP operation involves gradually elevating the program voltage, the program maintaining voltage also may be gradually elevated as the program voltage is elevated. For instance, after program maintaining voltages corresponding to the program voltages having different levels are respectively set, when a programmed memory cell is detected during the programming operation, a subsequent program maintaining voltage corresponding to the program voltage may be applied to the corresponding bit lines. Alternatively, when a programmed memory cell is detected irrespective of a program voltage, a program maintaining voltage may be elevated by a predetermined level and applied to the corresponding bit lines afterwards.

Step of Elevating Program Voltage (606)

When the voltages of the bit lines are reset, the program voltage may be elevated by a step level, and step 602 may be performed using the elevated program voltage. Steps 602 to 606 may be repeated using the above-described method until step 604 is passed.

Step of Counting Word Lines (607)

It may be determined whether the selected word line Sel.WL is the final word line of the selected memory cell block. When the selected word line Sel.WL is the final word line, the programming operation of the selected memory cell block may end. When the selected word line Sel.WL is not the final word line, the next word line may be selected (608), and the programming operation (steps 601 to 608) may be repeated until the final word line is selected.

Figure 7:
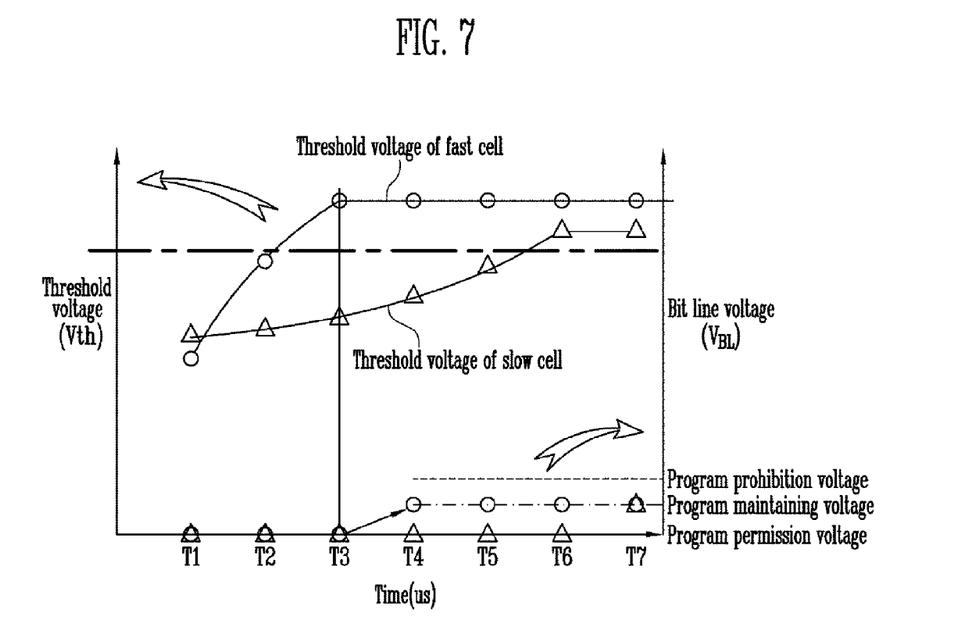
FIG. 7 is a graph of a threshold voltage and a bit line voltage, illustrating effects according to an example embodiment of the present invention.

FIG. 7 is a graph of a threshold voltage and a bit line voltage, illustrating effects according to an example embodiment of the present invention.

Referring to FIG. 7, in the case of a fast cell, when a program permission voltage is applied to a selected bit line and a gradually elevated program voltage is applied to a selected word line during a programming operation (T1 to T2), a threshold voltage may rapidly increase and become higher than a target level at a time point T3. Here, the time point T3 when the threshold voltage becomes higher than the target level is only an example and may vary according to a memory device. Conversely, in the case of a slow cell, since the threshold voltage is lower than the target level even at a time point T3, a programming operation for elevating the threshold voltage should be repeatedly performed. During the programming of the slow cell, a program maintaining voltage lower than the program prohibition voltage and higher than the program permission voltage may be applied instead of the program prohibition voltage to a bit line connected to the fast cell as described above. When the program maintaining voltage is applied to bit lines connected to programmed memory cells, boosting may minimally occur in channel regions of the corresponding cell strings. Thus, leakage of the programmed memory cell may be prevented so that threshold voltages of the corresponding memory cells do not decrease but stay at a constant level.

Figure 8:
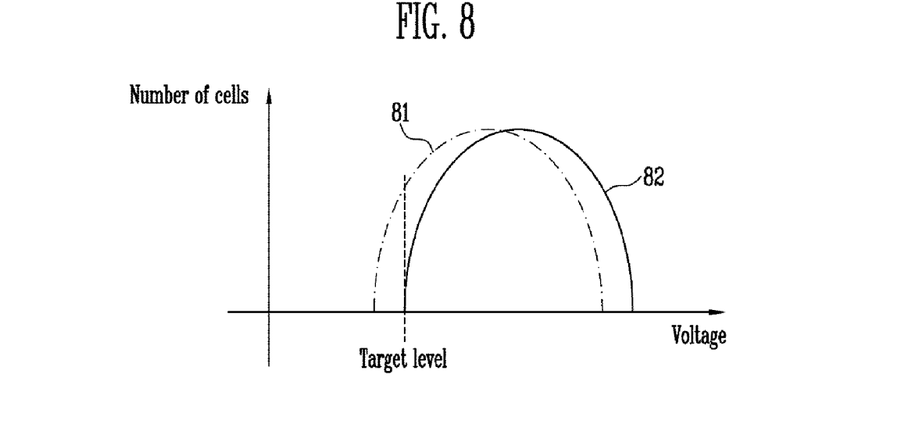
FIG. 8 is a graph of a threshold voltage, illustrating effects according to an example embodiment of the present invention.

FIG. 8 is a graph of a threshold voltage, illustrating effects according to an example embodiment of the present invention.

Referring to FIG. 8, as described in detail with reference to FIG. 7, a decrease (81) in threshold voltage due to under programming of memory cells having threshold voltages that have already become higher than a target level may be prevented during a programming operation for elevating threshold voltages of all memory cells higher than the target level. Therefore, the threshold voltages of the memory cells may be maintained at a higher level (82) than the target level.

According to the present invention, threshold voltages of memory cells that are programmed earlier than other memory cells can be prevented from becoming lower than a target level during a programming operation of a selected page, thereby improving the reliability of a programming operation.

In the drawings and specification, typical example embodiments of the invention are disclosed, and although specific terms are employed, they are used in a generic and descriptive sense only and not for purposes of limitation. As for the scope of the invention, it is set forth in the following claims. Therefore, it will be understood by those of ordinary skill in the art that various changes in form and details may be made therein without departing from the spirit and scope of the present invention as defined by the following claims.

What is claimed is:

1. A semiconductor memory device comprising:
a memory cell array including a plurality of memory cells;
a control circuit configured to control a programming operation for the memory cells coupled to a selected word line; and
a circuit group configured to apply a program prohibition voltage to bit lines coupled to memory cells not to be programmed, apply a program permission voltage to bit lines coupled to memory cells having a threshold voltage lower than a target level, among memory cells to be programmed, and apply a program maintaining voltage having a level between a program prohibition voltage level and a program permission voltage level to bit lines coupled to programmed memory cells to prevent a decrease in threshold voltage when the memory cells coupled to the selected word line are programmed.

2. The device of claim 1, wherein the circuit group comprises:
   a page buffer group configured to apply the program prohibition voltage or the program permission voltage to the bit lines in response to page buffer signals of the control circuit;
   a voltage generating circuit configured to output a program voltage for performing the programming operation on the memory cells to global lines in response to an operating signal serving as an internal command signal of the control circuit, generate the program maintaining voltage, and output the program maintaining voltage to the corresponding bit lines; and
   a row decoder configured to transmit the program voltage to the selected word line in response to row address signals of the control circuit.

3. The device of claim 2, further comprising:
   a column selection circuit configured to receive information related to the programmed memory cells from the page buffer group during the programming operation; and
   a pass/failure determining circuit configured to output address information in response to information received from the column selection circuit.

4. The device of claim 3, wherein the address information contains addresses of memory cells having a higher threshold voltage than the target level among the memory cells coupled to the selected word line.

5. The device of claim 1, wherein the program prohibition voltage is a power supply voltage.

6. The device of claim 1, wherein the program permission voltage is a ground voltage.

7. A method of operating a semiconductor memory device, comprising:
   applying a program permission voltage to selected bit lines and applying a program voltage to a selected word line to program memory cells coupled to the selected word line;
   performing a verification operation to compare a threshold voltage of the memory cells with a target level; and
   applying a program maintaining voltage to bit lines coupled to memory cells having a threshold voltage higher than the target level, applying a program permission voltage to bit lines coupled to memory cells having a threshold voltage lower than the target level, and applying a program prohibition voltage to unselected bit lines, as a result of the verification operation, wherein the program maintaining voltage has a voltage level between the program permission voltage level and the program prohibition voltage level.

8. The method of claim 7, further comprising repeating the programming operation until the programming operation of all the memory cells coupled to the selected word line is completed.

9. The method of claim 8, further comprising gradually elevating the program voltage during the repeating of the programming operation.

10. The method of claim 9, wherein the program maintaining voltage is maintained at a constant level or varied in response to the program voltage during the repeating of the programming operation and the verification operation.

11. The method of claim 10, wherein when the program voltage is varied, the program maintaining voltage is elevated in proportion to the program voltage.

12. The method of claim 7, wherein the program prohibition voltage is a power supply voltage.

13. The method of claim 7, wherein the program permission voltage is a ground voltage.

14. A method of operating a semiconductor memory device, comprising:
   verifying whether a threshold voltage of memory cells, to which a program voltage has been applied, is higher than a target level; and
   applying a program maintaining voltage to bit lines of memory cells having a threshold voltage above the target level during a subsequent programming operation, wherein a level of the program maintaining voltage is between a program prohibition voltage level and a program permission voltage level.

15. The method of claim 14, further comprising:
   applying the program permission voltage to selected bit lines and applying the program voltage to a selected word line to program memory cells coupled to the selected word line;
   performing a verification operation to compare the threshold voltage of the memory cells with the target level; and
   applying the program maintaining voltage to bit lines of programmed memory cells during the verification operation to perform a programming operation on the memory cells coupled to the selected word line.

16. The method of claim 15, further comprising repeating the programming operation until the programming operation of all the memory cells coupled to the selected word line is completed.

17. The method of claim 16, further comprising gradually elevating the program voltage during the repeating of the programming operation.

18. The method of claim 15, wherein the program prohibition voltage is applied to unselected bit lines during repeating of the programming operation.

* * * * *